United States Patent
Klíma et al.

(10) Patent No.: US 6,525,481 B1
(45) Date of Patent: Feb. 25, 2003

(54) METHOD OF MAKING A PHYSICALLY AND CHEMICALLY ACTIVE ENVIRONMENT BY MEANS OF A PLASMA JET AND THE RELATED PLASMA JET

(75) Inventors: Miloš Klíma, Brno (CZ); Jan Janča, Brno (CZ); Vratislav Kapička, Brno (CZ); Pavel Slavíček, Rajhrad (CZ); Petr Saul, Česká (CZ)

(73) Assignee: Masarykova Univerzita, Brno (CZ)

( * ) Notice: Subject to any disclaimer, the term of this patent is extended or adjusted under 35 U.S.C. 154(b) by 0 days.

(21) Appl. No.: 09/674,999

(22) PCT Filed: May 7, 1999

(86) PCT No.: PCT/CZ99/00012

§ 371 (c)(1),
(2), (4) Date: Nov. 9, 2000

(87) PCT Pub. No.: WO99/59385

PCT Pub. Date: Nov. 18, 1999

(30) Foreign Application Priority Data

May 12, 1998 (CZ) .......................................... PV 1476/98

(51) Int. Cl.$^7$ .............................................. H05B 31/26
(52) U.S. Cl. .............................. 315/111.21; 315/111.41; 118/723 DC
(58) Field of Search ........................ 315/111.21, 111.31, 315/111.41, 111.11, 111.71, 111.91; 118/723 DC

(56) References Cited

U.S. PATENT DOCUMENTS

| | | | |
|---|---|---|---|
| 4,386,258 A | * 5/1983 | Akashi et al. | 219/121.36 |
| 4,767,641 A | * 8/1988 | Kieser et al. | 118/50.1 |
| 5,053,725 A | 10/1991 | Geshe et al. | |
| 5,361,016 A | 11/1994 | Ohkawa et al. | |
| 5,716,500 A | * 2/1998 | Bardos et al. | 118/723 E |
| 6,280,802 B1 | * 8/2001 | Akedo et al. | 427/180 |

FOREIGN PATENT DOCUMENTS

| | | |
|---|---|---|
| CH | 653201 | 12/1985 |
| DE | 19540434 | 6/1997 |
| EP | 0408841 | 1/1991 |
| WO | 9414303 | 6/1994 |

* cited by examiner

*Primary Examiner*—Don Wong
*Assistant Examiner*—Ephrem Alemu
(74) *Attorney, Agent, or Firm*—Burns, Doane, Swecker & Mathis, L.L.P.

(57) ABSTRACT

The method consists in the fact that from at least one external source (3) electromagnetic energy is conducted to at least one hollow electrode (1) with elements (14) locally increasing the density of electromagnetic energy, by which, inside the cavities of the electrode (1) and/or at its orifice and in the external environment an intensive discharge is generated. The plasma jet consists of at least one hollow electrode (1) of conductive or conductive and dielectric material with at least one element (14) locally increasing the density of electromagnetic energy inside the hollow electrode (1) and/or at its orifice and/or outside, which consists of a design element (12) and/or a physical element (17) acting in the transversal and/or the longitudinal direction with respect to the streaming working medium (5) and is further constituted by at least one source (3) or electromagnetic energy attached via the impedance adapting member (4) consisting of a system of regulatory transformation and transfer elements, onto the conductive part of the hollow electrode (1).

9 Claims, 3 Drawing Sheets

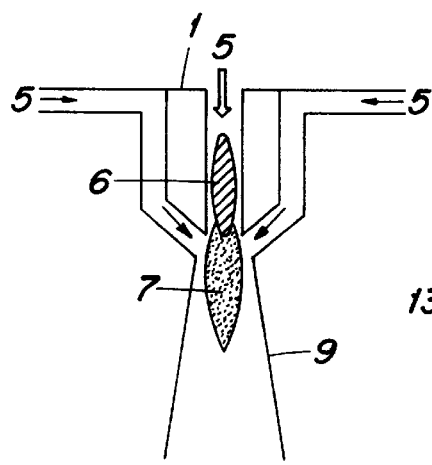
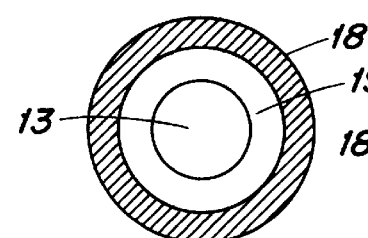
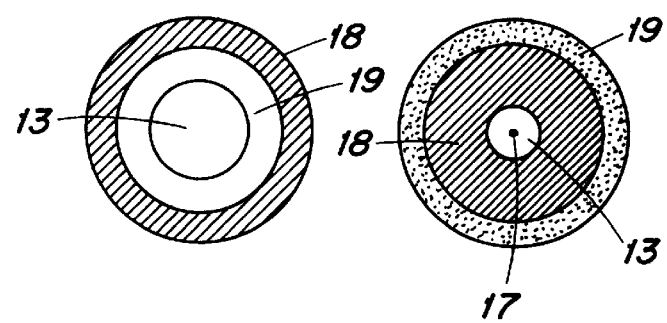
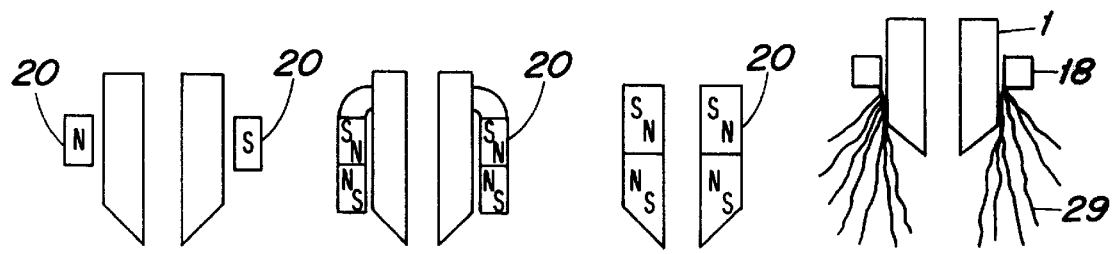
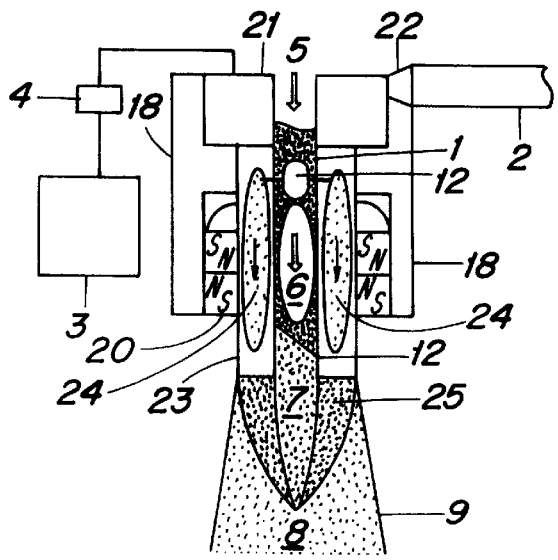
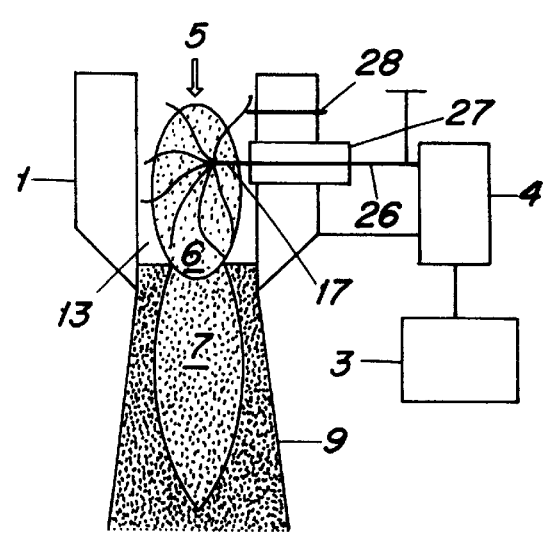

METHOD OF MAKING A PHYSICALLY AND CHEMICALLY ACTIVE ENVIRONMENT BY MEANS OF A PLASMA JET AND THE RELATED PLASMA JET

FIELD OF TECHNOLOGY

The invention concerns the method of making a physically and chemically active environment by means of a plasma jet which permits the transformation and the oriented transfer of electromagnetic energy in its different forms by means of a plasma, from the plasma jet to the treated object.

BRIEF DESCRIPTION OF THE RELATED ART

For making a physically and chemically active environment utilised for the treatment of objects or chemical compounds currently a broad spectrum of discharges generated in different ways on the basis of electromagnetic energy are used which in turn affect the activated medium or directly the treated objects.

From CZ 246982 a method of spatially oriented chemical activation of the working gas by plasma is known in the region between the jet attached via the adapting member to the source of high-frequency (hf) energy with a non-symmetric output and the earthed electrode attached to the second output of the above source. The use of the method is only limited to low pressures, a gaseous working medium and an external plasmatic environment.

From PV 03925-90.J CZ—priority Sept. 9, 1990 and WO 95/11322 modifications of the preceding mentioned method are known, characterised by the fact that the generation of the discharge activating the working gas passing through the jet takes place already inside the hollow electrode in the working regime of the so-called high-frequency hollow cathode. In WO 95/11322, as against PV 03925-90.J CZ, the in turns discharge and non-discharge operation regime is utilised for sputtering the material of the electrode, in PV 03925-90.J CZ a permanent magnet situated axially symmetrically outside the jet is used for orienting plasmochemical processes. These two methods are only limited to low pressures, a gaseous working medium and an external plasmatic environment.

According to WO 96/16531 the plasma is generated under low pressure in a gaseous working medium, by means of the so-called hf hollow cathode of linear geometry and plasmochemical processes are oriented by means of an additional magnetic field of other than axial symmetry from permanent magnets or electromagnets.

From SE 9302222-6 a modification of the preceding patents is known where the hollow electrode is fed from a microwave source.

The main drawback of the above methods and equipment for their performance is the fact that they are only limited to low pressures up to $10^{2-3}$ Pa, a gaseous working medium and an external plasmatic environment.

From Jpn. J. Appl. Phys. 33 (1994), L 197, a method of generating hf plasma under atmospheric pressure is known. In this case the hf. discharge is not generated in the electrode with a hollow geometry, but on a compact needle electrode inserted into the dielectric tube flown through only by the working medium in the gaseous state. The disadvantage of this method and equipment is the fact that the discharge is generated on the fill needle electrode, by which the plasmochemical processes of activating the streaming working medium are not so much effective as in the case of the discharge in the hollow electrode. It is applicable only in a medium formed by the gaseous phase, where the oriented reaction channel is formed, capable of activating a further object or the working medium.

In Plasma Sources Sci. Technol. 6, 1997, 468–477 a method is described of generating a high-pressure discharge of the type of a direct current hollow cathode in a gas without a flow through regime. The equipment consists of two electrodes, of which the cathode has a cavity with a cylindrical symmetry with the inner diameter of about 0.2 to 0.7 mm and which is separated from the anode immediately linking up with the cathode hollow by a layer of the dielectric material. It is thus not a plasma jet because only gas is used without the flow through regime. The equipment is not used for the activation or adaptation of any further activated working medium or object and the electrodes are fed only from a direct current source.

From CZ 282566 B6 and Proc. of $18^{th}$ Symp. on Plasma Phys. and Technology, Prague, 1997, 144–146, a method is known of generating a volume corona discharge in water or in water with admixtures between the electrodes to which pulse voltage is applied, characterised by the fact that the intensity of the electric field in the proximity of at least one of the electrodes increases by a partial coverage of this electrode by a solid and/or gaseous dielectric, and on the surface of the electrode spots are formed of the contact of the electrode material, the solid and/or gaseous dielectric and/or water (the so-called "triple points" of different dielectric constants). The equipment for performing this kind consists of a big cylindrical metal reactor which is at the same time one electrode flown through slowly by the above liquid medium. The second rod-shaped electrode is placed longitudinally in the axis of that reactor. The method of generating the discharge can be carried out only in the aqueous medium. The equipment is voluminous and only works when using a very efficient pulse source of direct current electric energy (of the order of tens of MW in a pulse—Proc. of the $18^{th}$ Symp. on Plasma Phys. and Technology, Prague, 1997, 144–146).

All these methods are closely connected with an actual and highly specific arrangement of plasma generating equipment and highly specific working conditions (working environment, medium, pressure, temperature, frequency of the excitation electromagnetic energy, power output of its source, etc.). The facilities used in practice are usually narrowly specialised, spacious and they require a closed room (e.g. vacuum facilities) or are highly requiring for energy consumption (e.g. plasmatrons—tens kW) or 15 for the method of discharge generation (such as a pulse corona—tens of kW to MW in a pulse). Hitherto no possibility has existed of targeted, space narrowly directed, sufficiently fine, but effective, superficial or small-volume adaptations of objects under higher pressures (particularly in free atmosphere or in a liquid medium), carried out by a single facility in the whole spectrum of frequencies of the source voltage.

SUBJECT MATTER OF THE INVENTION

The above drawbacks are removed by the method of generating a physically and chemically active environment by means of the plasma jet, according to the invention consisting in the fact that from at least one external source of performance of about $10^0$ to $10^3$ W and voltage amplitude of the order of $10^1$ to $10^4$ V with the possibility of its modulation at the frequency range of DC (ss), low frequency (nf), high frequency (hf) or microwaves (vhf) electromagnetic energy is conducted to at least one hollow electrode flown through by the stream of the working medium in which an electromagnetic field is formed in the longitudinal and/or transversal direction of the electrode cavity and/or its orifice, and at the same time free carriers of the charge are generated by the action of elements locally increasing the density of electromagnetic energy and collision processes of particles in the working medium and on the surface of the hollow electrode by which, inside tee electrode cavities or/and at its orifice and in the external medium an intense discharge is generated or a system of primary and filamentary discharges with their own internal streaming which are carried by the flowing through working medium which are gradually activated and thus formed plasma, together with the streaming and henceforth activating working medium flow through the hollow electrode and in the external medium at subsonic or supersonic speed with contemporaneous generation of a pointed reaction channel at the pressure of $10^3$ to $10^6$ Pa.

The transfer of electromagnetic energy into the discharge carried by the working medium is matched adapted.

The working medium and the external medium is a gas, a liquid or their mixtures or a mixture of solid particles with the gas, liquid or their mixtures.

The process of plasma generation and the activation of the working medium is advantageously co-generated and controlled by another magnetic field formed from a permanent magnet and/or from an electromagnet or their system.

The plasma jet for generating a physically and chemically active environment according to the invention consists in the fact that it is formed by at least one hollow electrode of conducting or conducting and dielectric material with at least one element locally increasing the density of electromagnetic energy inside the hollow electrode and/or at its orifice and/or outside which is constituted by a construction element and/or a physical element operating in the transversal and/or longitudinal direction with respect to the streaming working medium and further it is constituted by at least one source of electromagnetic energy attached via the system of regulation, transformation and transfer elements to the conducting part of the hollow electrode.

The design element consists of the rough surface of the electrode material and/or the cavity and/or the projection and/or point and/or edge placed inside the electrode cavity and/or outside and/or in its orifice; and/or of openings and/or slits formed inside the hollow electrode and/or a contact place of the conducting part of the electrode with dielectric material.

The physical element is selected from a group consisting of the supplementary electrode of different potential than the hollow electrode and/or the source of electrically charged particles or particles excited into higher energy levels of excited particles and/or a source of photons or particles with high energies operating in the transversal and/or longitudinal direction with respect to the streaming working medium.

With an advantage a magnet and/or an electromagnet is placed inside or outside the hollow electrode.

The hollow electrode is fixed to a non-conductive holder which permits manual or mechanical handling.

In this way it is possible to make four fundamental types of highly variable and dynamic high-pressure one pole (feeding the electrode with hf energy) or dipole (source of electromagnetic energy without band limitation) discharges or systems of discharges which can link up with each other and which are blown out of the cavity of the plasma jet or walls of its orifice and directed in the external environment. These fundamental types of discharges are as follows:

1. A high-pressure discharge or a system of discharges generated inside the hollow electrode which is a constituent of the plasma jet and/or forms it, and is blown out of it or which is blown out of the walls of its orifice and/or the system of its cavities (multicellular discharge). This discharge or the system of discharges can be characterised by two limiting states:
    a) The plasma is actively generated inside the electrode cavity only at the negative part of the voltage amplitude on the electrode (the hollow electrode is the cathode—from about the frequency of 1 kHz the plasma keeps in the electrode cavity permanently).
    b) The plasma is actively generated inside the electrode cavity irrespective of the voltage amplitude on the electrode (e.g. by the above elements locally increasing the density of electromagnetic energy).
1. A high-pressure "aggravated" discharge or system of discharges which is blown out from the hollow electrode from which it is at least partly separated by a layer of dielectric material or which is blown out from the walls of its orifice and/or the system of its cavities.
2. A high-pressure discharge or a system of discharges liking up with the discharges of types 1 and 2, and which is generated by dielectric elements of the hollow electrode, will take place by:
    c) polarisation and/or the accumulation of the polarisation charge on the walls and edges of the dielectric tube or other dielectric elements of the electrode jet,
    d) increasing the density of electromagnetic energy on the transitions conducting material —dielectric (and/or dielectric material of different dielectric constant).
1. A high-pressure discharge or a system of discharges linking up with discharges 1 to 3 outside the hollow electrode in the external environment or the flickering of the plasma generated in discharges 1 to 3.

The rise and permanent generation of the individual discharges or systems of discharges by means of the above facility will take place on fulfilling the following design, working and existence conditions:
1. The rise of the first type of discharge will take place on condition that the middle free electron trajectory in the given working medium under the given pressure remains essentially lower and/or comparable in order with the smallest dimensions of the plasma jet cavity and/or the discharge space outside its orifice and, besides, at the direct-current or low-frequency feeding of the plasma jet under the assumption that the smallest dimension of the cross-section of the electrode cavity be larger than the minimum distance of the negative light from the cathode.
2. The second type of discharge is not limited by the mutual relation of the middle free trajectory of electrons in the given working medium under the given pressure and the smallest dimension of the cavity cross-section of the plasma jet constituting its inner discharge space and/or discharge spaces outside its orifice, just when the so-called "aggravated" type of discharge is used inside the hollow electrode, i.e. when the inner discharge space is separated from the conducting part of the electrode cavity by a layer of dielectric material, particularly for the transmission of high-frequency energy.

The blown-out discharge, or the system of discharges from the orifice of the electrode jet can be, even despite its conspicuous species diversity, partly characterised by the temperature of neutral particles in the plasma approximated from the rotary temperature of the OH molecule varying between 300 and 1000 K according to the chosen design variant, the employed working medium and the method of application.

Under low pressures (about $10^0$–$10^3$ Pa) in a gaseous or a plasmatic environment these discharges pass continuously into some known kinds of discharges blown out of the plasma jet of hollow geometry (a hollow cathode, etc.).

The method and equipment according to the invention are utilisable in any medium and at any pressure.

I can be utilised:
1. in a targeted way for the activation and modification of the gas, liquid, mixture of gas and liquid or liquid borne dust particles or small objects flowing through the plasma jet
2. for the modification of surfaces of objects
3. for the volume modifications of the treated object
4. for the modification of immersed or dispersed minor objects or compounds situated in the treated objects
5. for the activation of a further working medium consequently affecting the treated objects and/or compounds
6. for the change in the material of the plasma jet or its parts
7. for the plasmochemical synthesis of compounds in the solid, liquid, gaseous, plasmatic or mixed state
8. the employment of the invention is also possible on biological objects (particularly at the high-frequency method of generating the discharge) and other applications.

In manual work with the plasma jet immediate and direct checking of plasmochemical processes and their effects on the treated object is possible, which is excluded or considerably limited when the object is placed in a plasmochemical reactor.

BRIEF DESCRIPTION OF THE DRAWINGS

In FIGS. 3 through 8, 9a, 9b, 10a–10d, 12a, 12b and 16 two different design varieties of the hollow electrode are given.

In FIGS. 2, 11 and 13a, b, c there are simple types of the plasma jet.

In FIGS. 14 and 15 design variants of the plasma jet are represented.

EXAMPLES OF VERSION

The examples of the design version of the hollow electrode and the graphic presentation of the plasma jet.

Figures 3, 4, 5, 6:
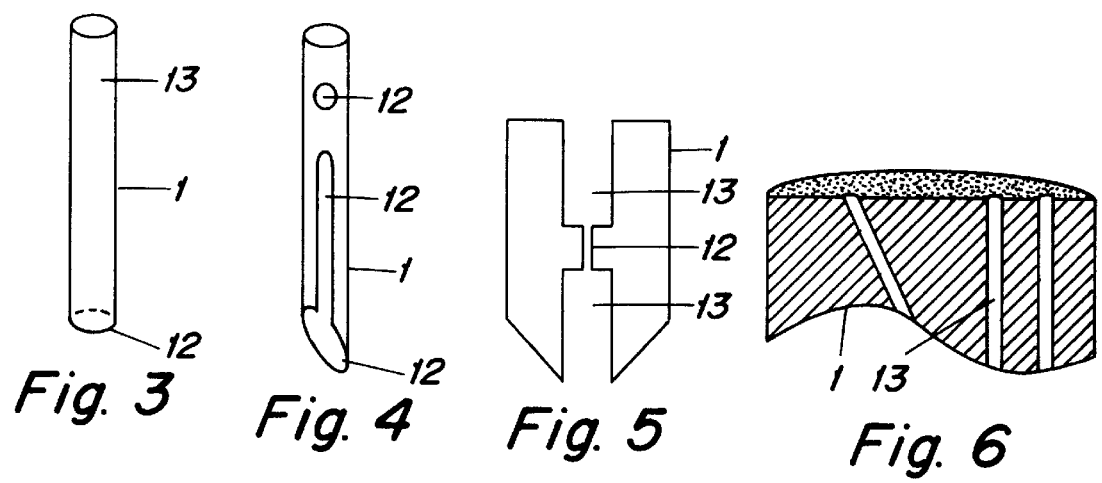

The fundamental design variant of the hollow electrode 1 is a hollow cylinder with at least one element locally increasing the density of electromagnetic energy, which is e.g. the design element 12 constituted by the roughed surface of cavity 13 of the electrode 1, or a nose represented e.g. in FIG. 5 or a point in FIGS. 4, 5 or an edge, openings or slits made in the hollow electrode 1 represented in FIGS. 3 and 4.

Figures 10A, 10B:
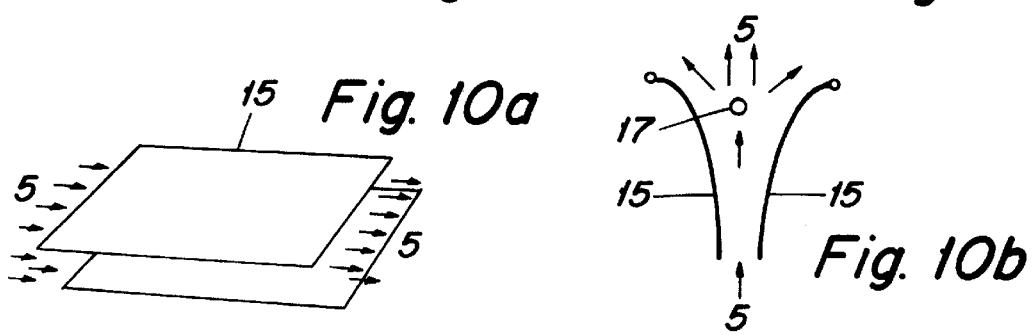

An element locally increasing the density of electromagnetic energy can also be the physical element 17 which is introduced into the cavity 13 of the electrode 1 or to its orifice (FIGS. 10b, d, 12b, 15).

Another design variant is based on the preceding variants. The fundamental variant of the hollow electrode 1 is completed by dielectric parts. The internal and/or external walls of the electrode/-s 1 are at least partly covered with a layer of dielectric material 18 and/or a system of full and/or hollow and/or porous dielectric materials 18 surrounding the electrically conductive parts 19 and/or they are inside their cavities, as represented in FIGS. 12a, b, where 18 is dielectric material and 19 the electrically conductive part.

Figures 7, 8, 9A, 9B:
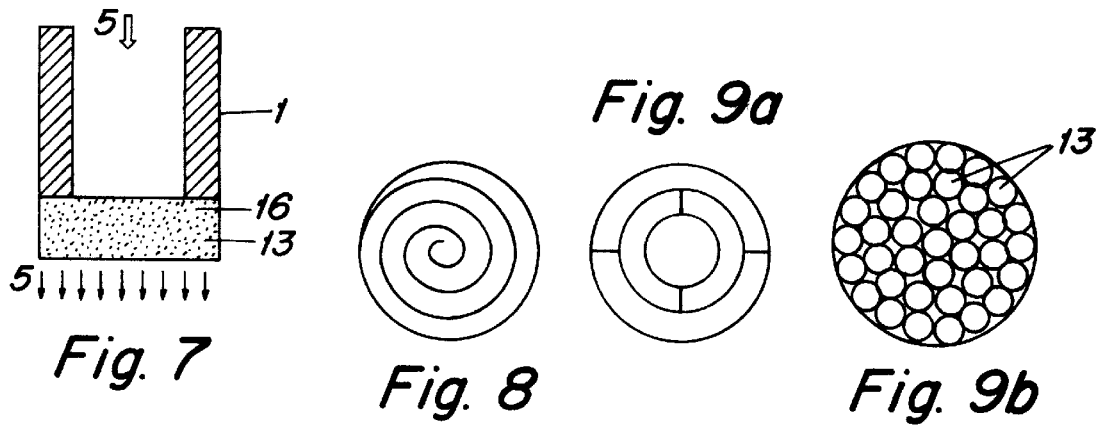

The hollow electrode 1 is constituted by a system of cavities 13 made in the electrode 1, as shown in FIGS. 5, 6. According to FIG. 7, cavities 13 flown through by the working medium 5, are formed by spaces among porous material 16, electrically conductive or non-conductive, which can be balls or a net. Cavities 13 of the electrode 1 can also be formed by a plate wound into a spiral or a system of cylinders or their parts placed in one another as represented in FIGS. 8, 9a, b which, besides, can be shifted longitudinally with respect to each other, the cylinder situated in the centre not having to be hollow (a full point).

Figures 10C, 10D:
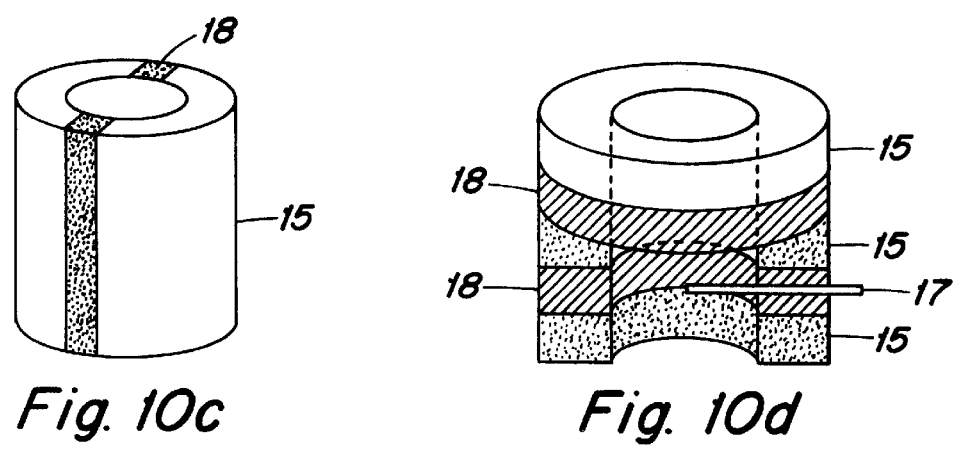

Another design variant is a system of segments 15 constituting a cavity 13 or cavities 13 of the electrode 1, represented in FIGS. 10a, b, c, d. The individual segments 15 can be separated from each other by dielectric material 18 (FIGS. 10c, d) or they can be freely aggregated (FIGS. 10a, b) and separated from each other only by the working medium.

The design solution of the hollow electrode 1 represented in FIG. 16 has a cluster or wad of fine fibres 29 or a swab of inorganic or organic materials such as glass, metal, pottery, cotton, horse hair, synthetic fibres, etc., fastened to the electrode 1 via the insulating dielectric material 18, or another instrument with which it is possible to modify the surface of the plasma treated object, such as a pencil or a graving tool.

EXAMPLE 1

Figure 1:
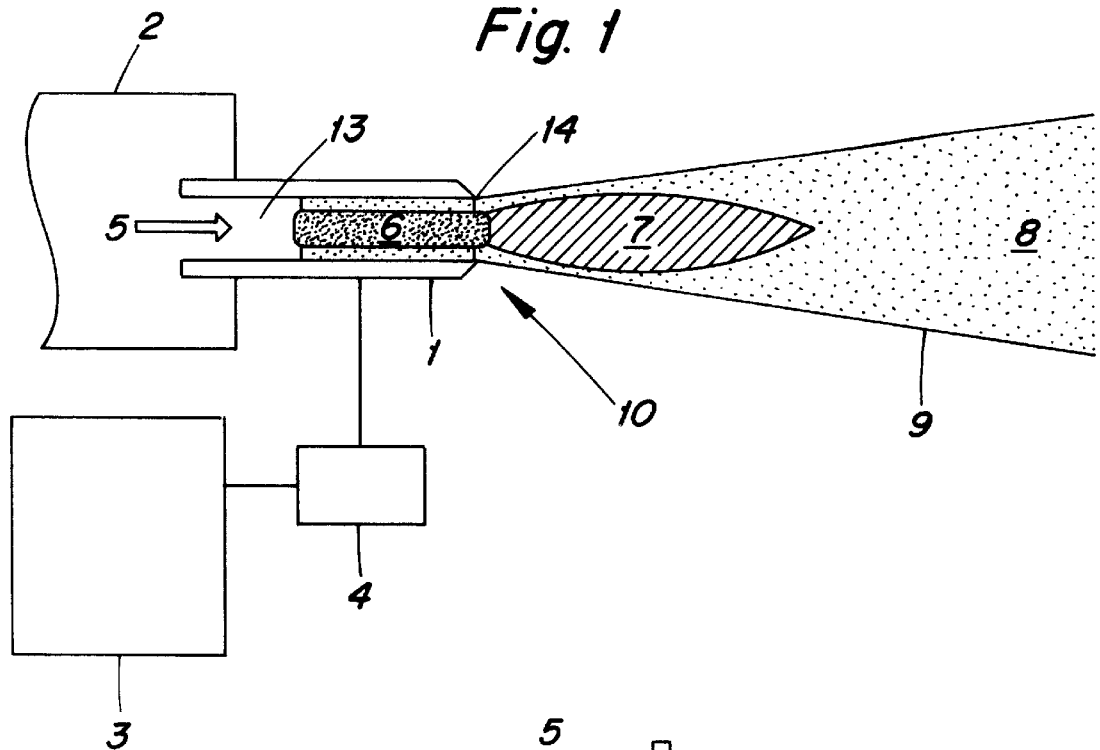
In FIG. 1 the principle of the plasma jet is demonstrated for generating a physically and chemically active environment and, at the same time, the simplest example of an advantageous design of the equipment.

The simplest design variant put in effect of the plasma jet is represented in FIG. 1 for the case in which the ambient environment of the plasma jet is in the gaseous or plasmatic state, at the pressure higher than about $10^3$ Pa, and/or in free atmosphere or at a pressure higher than the atmospheric pressure. Electrode 1 is in the form of a hollow cylinder with a conical narrowing, with element 14 locally increasing the density of electromagnetic energy, constituted by the sharpened edges of the cavity orifice 13 of electrode 1. This type is preferably employed in a system with an external counterelectrode or it serves as physical element 17 for the generation of the discharge inside cavity 13 and further electrode 1.

To the hollow electrode 1 through which the working gas 5 flows is, via the impedance adapting member 4 consisting of a system of regulatory, transformation and transmitting elements, attached a ss, nf, hf or vhf source 3. The hollow electrode 1 is fixed to a motile holder 2 of dielectric material by means of which it is possible to control the plasma jet easily. At the point of the orifice of the hollow electrode 1 a high density of electromagnetic energy arises which, besides, is potentiated by stripping the spatial charge from the walls and points of electrode 1 by the streaming working medium 5, thus constituting a possibility of an easy ignition of the discharge 7 at the orifice of the electrode 1. The discharge 7 penetrates in the negative current alternation of the source voltage amplitude or in its negative pulse to the cavity 13 of the electrode 1, where it generates a highly intensive type of discharge 6. Discharges 6 and 7 activate the streaming medium 5. The thus generated plasma 8 streams through the cavity 13 of the electrode 1 and through its orifice into the external environment, where it constitutes a pointed reaction channel 9 in which the working gas 5 is in turn activated, at the same time permitting the adaptation of objects in the outer environment. The originating interaction processes 10 markedly feedback affect the process proper of plasma generation.

EXAMPLE 2

Figure 2:
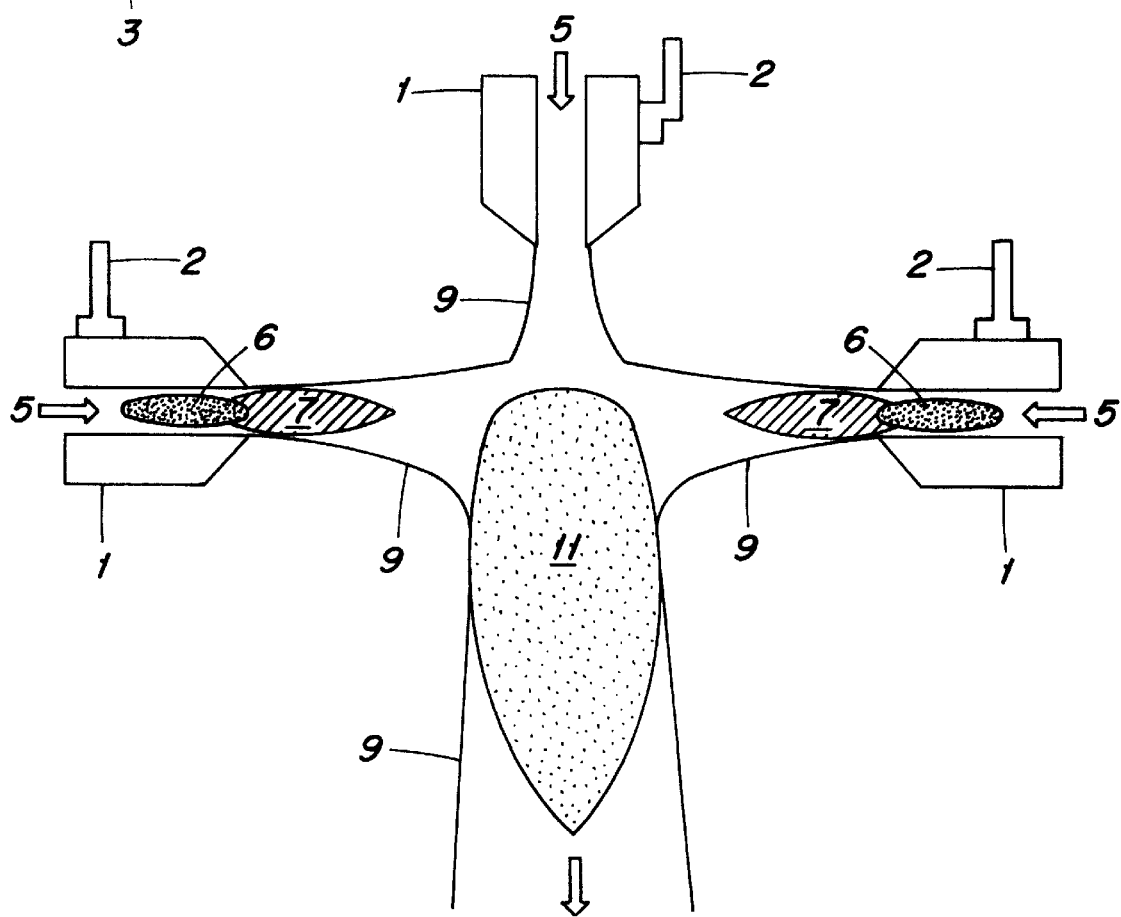

The plasma jet represented in FIG. 2 consists of a system of hollow electrodes 1, of which at least one is the source of physically and chemically active environment and at least one is mechanically or directly manually controllable by means of the holder 2.

On the basis of a conflict of two and more reaction channels 9 from the individual hollow electrodes 1 a resultant reaction channel 11 arises with formations of streaming plasma (usually much more voluminous then the primary reaction channels) which newly or further activated the fed working medium 5.

EXAMPLE 3

FIG. 11 represents a schematic drawing of the plasma jet, when the material of the electrode 1 is cooled by the streaming medium 5 which is advantageously utilised after fulfilling its cooling function to the subsequent activation in some of the domains of physically and chemically activated environment 6 and 7, or it is utilised for modelling the shape of the reaction channel 9.

A part of the plasma jet of all above variants can be a permanent magnet 20 and/or an electromagnet or their system located outside the plasma jet (FIGS. 13a–c) which participates in the formation and controls the process of plasma generation.

EXAMPLE 4

Another design variant with a combination of conductive and dielectric material is represented in FIG. 14 and it can be used in any working medium, in the gaseous state or in the combination with a loose mixture and/or with tiny droplets or vapours of a liquid, without employing a couterelectrode at the pressure of $10^3$ to $10^6$ Pa.

The electrode 1 is made of Ta, Mo, Pt, Ni, steel or any metal and non-metal materials physically and chemically resistant electrically conductive materials in the form of a hollow needle in whose mantle there is a design element 12 formed by the opening. The electrode 1 is set in the carrier part 21 attached to the source 3, such as hf energy (13.56 MHz, 10–500 W) via the impedance adaptation article 4 and to the feeder of the working gas 5. This carrier part 21 is fixed to a non-conductive holder 2 via its movable and rotation part 22. The electrode 1 is covered with the concentrating insulating capillary 23 made of quartz glass with the possibility of controlling the depth of immersion of the hollow electrode 1 into the capillary 23 and at the same time, it is shifted coaxially with a permanent magnet 20 with the possibility of independent vertical movement by fixing via dielectric material 18 to the carrying part 21.

The working medium 5 flows on the one hand inside the electrode 1, on the other hand through the design element 12, through which it flows into the space between the electrode 1 and the wall of the capillary 23, thus allowing the cooling of the capillary 23. On the basis of physical processes at the orifice of the hollow electrode 1 an intense hf discharge 6 is initiated inside the cavity of the electrode 1—of the type of the high-pressure virtual hollow cathode which is blown out from its orifice and which is afterwards modelled by the capillary of quartz glass 23 and by the magnetic field generated by magnets 20. In the discharges 6 and 7 the working medium 5 is permanently activated. The thus streaming plasma 8 forms a pointed reaction channel 9 in the external environment. In applications below the level of the liquid, in the space between the wall of the capillary 23 and the electrode 1 a complementing hf discharge 24 is generated (capacitively coupled, across the wall of the dielectric pipe, to the liquid), which causes the activation of the working medium 5 flowing through this space. On the output from the electrode 1 the working medium 5—gas activated in the discharges 6, 7 and 24 and the resulting salient discharge 25 form together a reaction channel 9.

EXAMPLE 5

Another advantageous design is the variant represented in FIG. 12b, where on the dielectric material 18 in the form of a capillary of quartz glass with inner diameter of about 0.01 to 5 mm a conductive layer 19 (graphite, copper, etc.) is applied from the outer side. On the conductive layer 19 hf energy is conducted from the source (5 to 50 W, 13.56 MHz) via the adaptation member. The discharge is initiated by the high density of electromagnetic energy at the orifice of the electrode near the margin of the conducting layer 19 forming the hollow electrode 1 and it is pulled into the cavity 13 formed by the dielectric material 18. This design variant is suitable for the activation of a gaseous working medium or a mixture of gas and a liquid (aerosol), particularly for highly local treatments of surface of objects or the treatment of a microvolume of a liquid at the pressure of $10^3$ to $10^6$ Pa.

This valiant can be combined with a physical element 17 placed inside the cavity of dielectric material 18, such as a tungsten or steel or copper wire inserted transversally and/or longitudinally into the cavity 13 (and which are on another potential than the hollow electrode 1). Then it is possible to activate with the plasma also a liquid working medium.

EXAMPLE 6

Another actual variant is represented in FIG. 15. It can be used in any of the above external environments and in using any working medium at the pressure of $10^3$ to $10^6$ Pa. Into the electrode 1 of an arbitrary shape attached to the source 3 of ss, nf, hf or vhf energy via the impedance adapting member 4 and flown through by the medium 5 a suitable physical element 17 is introduced from the side penetrating into the cavity 13 of the electrode 1. In the presented case the additional electrode 26 on another potential than the electrode 1 is chosen as a physical element 17. This additional electrode 26 consists of a molybdenum, tantalum, tungsten and/or steel wire or a graphite rod and it is separated from the material of the electrode 1 by the capillary 27 of quartz glass, pottery or teflon. Between the surface of the cavity wall 13 of the electrode 1 and the point of the additional electrode 26 in the streaming environment of the working medium 5 a marked potential gradient arises on whose basis the primary initiation discharge is generated (in the given case—an arc or a corona 28), which in turn initiates the intense discharge 6 inside the cavity 13. A secondary intense discharge of the type of a high-pressure virtual hollow cathode 6 and/or the flickering primary discharge 28 carried by the stream of the activated working medium 5 spouts from the orifice of the electrode 1 and flickers or passes into another type of discharge 7 in the outer environment. The stream of the activated working medium 5 together with the streaming plasma forms in the outer environment the pointed reaction channel 9.

EXAMPLE 7

The plasma jets can be used for a fine finishing of details after mechanical or laser machining, for a fine finishing or creating details in jewellery, goldsmith and glassmaker works or in artist and restoration works, particularly in removing, sputtering or repairing painting, writing or a protective layer on objects and/or the regeneration and preservation of these objects.

Fragments of much corroded archaeological glass with local layers of precipitates of the thickness up to 1 mm and layers of hydrated silicon oxide of the thickness of 20 to 200 micrometres with a substantial representation of different deposited compounds causing a strong coloration up to the opacity of the material were put in a 1% material solution of Complexon III. ($C_{10}H_{14}O_8N_2Na_2.2H_2O$) in distilled $H_2O$ and exposed to the action of the equipment. Gradually at the pressure from about $10^3$ Pa and higher the following variants of the working medium were tested—Ar, $N_2$, Ar+$N_2$, Ar+$H_2$, Ar+$SF_6$, Ar+$C_3F_8$, Ar+C—$C_4F_8$, etc. The output supplied from the source of hf energy varied within 50 to 200 W (13.56 MHz), the time of application in minutes. Glass archaeological fragments were cleaned in all tested cases after the application of the equipment.

Analyses of fragments after the application of the above described method carried out on a scanning electron microscope with an energy dispersing and wave dispersing analyser have shown that the essence of obtained cleaning effect resulting in making the fractions of glass transparent is a marked reduction of compounds containing Fe, Mn, Ca, P, K and others from the corrosion layers, but there was a mild enrichment of the gel layer by Na. The application of particularly $SF_6$ as an admixture of the working gas permitted a conspicuous reduction of the porosity of the surface of gel layers by their smoothing by means of etching processes.

In the application of the method the overall rate and efficiency we observed, but also the delicacy of cleaning the surface of corroded glass (including the localising possibility of treatment on the surface of the fragment) outweighed many a times the effects of the classical application by the plasma of inactivated liquid. This fact is due to quite different mechanisms of physico-chemical reactions taking place in the contact of the activated medium or discharge with the liquid and at the same time with the surface of the object.

INDUSTRIAL UTILITY

The invention can be utilised particularly in laboratories of physical and chemical orientation, in the branch of material engineering, in microelectronics, in electrotechnical, engineering, chemical, textile, glass-making and cosmetic industries, in medicine, in ecology, for restoring and preserving objects of the cultural heritage, in art activity, etc. In the application of the invention, in the case of employment high-frequency energy (frequency higher than 1 MHz), no serious injury by electricity threatens any operator or any possible living object of the applications, but it must not be applied in the presence of persons with cardiac pacemakers.

What is claimed is:

1. A method of generating a physically and chemically active environment by means of a plasma jet, the method comprising conducting electromagnetic energy from at least one external source of output about $10^0$ to $10^3$ W and a voltage amplitude of the order of $10^1$ to $10^4$ V with the possibility of its modulation at frequency range DC (ss), low frequency (nf), high frequency (hf) or microwaves (vhf) to at least one hollow electrode, the at least one hollow electrode having elements, the elements locally increasing a density of electromagnetic energy flown through by a stream of a working medium in which an electromagnetic field is generated in the longitudinal and/or transversal direction of a cavity of the electrode or at its orifice and, at the same time, actions of the elements generating free carriers of the charge thereby locally increasing the density of electromagnetic energy and by collision processes in a working medium and on a surface of the hollow electrode by which, inside cavities of the electrode and/or at its orifice and in the external environment an intensive discharge originates or a system of primary and filamental discharges with their own internal streaming which are carried by the flowing working medium which they gradually activate and a plasma thus generated, together with the streaming and further activating working medium flows through the hollow electrode and in the external environment at a subsonic or supersonic speed with a simultaneous generation of a pointed reaction channel at the pressure of $10^3$ to $10^6$ Pa.

2. The method according to claim 1, wherein the transfer of electromagnetic energy into the discharge carried by the working medium is impedance adapted.

3. The method according to claim 1, wherein the working medium and an external medium is a gas, a liquid or their mixtures or a mixture of solid particles with a gas, a liquid or their mixtures.

4. The method according to claim 1, wherein the process of plasma generation and activation of the working medium is cogenerated and regulated by another magnetic field generated from a permanent magnet and/or an electromagnet or their systems.

5. The plasma jet for generating a physically and chemically active environment according to claim 1, it is constituted by at least one hollow electrode of conductive or conductive and dielectric material with at least one element locally increasing the density of electromagnetic energy inside the hollow electrode and/or at its orifice and/or outside which is constituted by a design element and/or a physical element acting in the transversal and/or the longitudinal direction with respect to the streaming working medium and it is further constituted by at least one source of electromagnetic energy which is attached via the impedance adjustment member constituted by a system of regulatory, transformation and transfer elements to the conductive part of the hollow electrode.

6. The plasma jet according to claim 5, wherein the design element is constituted by a rough surface of material of the electrode or the cavity or a projection or a point or an edge placed inside the cavity of the electrode or outside or in its orifice; or openings or slits formed in the hollow electrode or openings or slits formed in the hollow electrode or a contact place of the conductive part of the electrode with dielectric material.

7. The plasma jet according to claim 5, wherein the physical element is chosen from a group comprising an additional electrode of a different potential than the hollow electrode and/or a source of electrically charged particles or particles excited to higher energy levels and/or a source of photons or particles with high energies acting in the transversal and/or longitudinal direction with respect to the streaming working medium.

8. The plasma jet according to claim 5, wherein the hollow electrode or outside the hollow electrode a magnet and/or electromagnet is placed.

9. The plasma jet according to claim 5, wherein the hollow electrode is fixed to a non-conductive holder permitting manual or mechanical control.

* * * * *